United States Patent
Morita

(10) Patent No.: US 12,406,828 B2
(45) Date of Patent: Sep. 2, 2025

(54) OPTICAL SYSTEM ADJUSTMENT METHOD FOR MULTI CHARGED PARTICLE BEAM APPARATUS AND COMPUTER READABLE RECORDING MEDIUM

(71) Applicant: NuFlare Technology, Inc., Yokohama (JP)

(72) Inventor: Hirofumi Morita, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 422 days.

(21) Appl. No.: 18/159,177

(22) Filed: Jan. 25, 2023

(65) Prior Publication Data
US 2023/0260749 A1      Aug. 17, 2023

(30) Foreign Application Priority Data
Feb. 15, 2022   (JP) ................................. 2022-021384

(51) Int. Cl.
*H01J 37/317* (2006.01)

(52) U.S. Cl.
CPC ... *H01J 37/3177* (2013.01); *H01J 2237/0437* (2013.01); *H01J 2237/083* (2013.01);
(Continued)

(58) Field of Classification Search
CPC ........... H01J 37/3177; H01J 2237/0437; H01J 2237/08; H01J 2237/24578; H01J 2237/30488; H01J 2237/31762
See application file for complete search history.

(56) References Cited

U.S. PATENT DOCUMENTS 6,107,637 A * 8/2000 Watanabe ............. H01J 37/222
250/548
10,109,458 B2   10/2018 Iizuka
(Continued)

FOREIGN PATENT DOCUMENTS

JP     2006-86182 A      3/2006
JP    2017-220615 A     12/2017
(Continued)

OTHER PUBLICATIONS

Taiwanese Office Action issued in Taiwan application 112103291 (filed Jan. 31, 2023), 11 pgs. (with machine generated English translation).
(Continued)

*Primary Examiner* — David P Porta
(74) *Attorney, Agent, or Firm* — Oblon, McClelland, Maier & Neustadt, L.L.P.

(57) ABSTRACT

A multi charged particle beam apparatus irradiates a substrate placed on a stage with a multi charged particle beam through an illumination optical system including a plurality of components, and an objective lens successively. In one embodiment, an optical system adjustment method for the multi charged particle beam apparatus includes measuring positional deviation amounts of a plurality of individual beams included in the multi charged particle beam at two or more different heights in an optical axis direction of a measurement surface or an imaging position of the multi charged particle beam, calculating a normalized position difference based on the two or more heights and the positional deviation amounts, the normalized position difference being an illumination system aberration equivalent amount of the illumination optical system, and adjusting a set value for at least one of the plurality of components using a value of the normalized position difference.

10 Claims, 4 Drawing Sheets

(52) U.S. Cl.
CPC ............... *H01J 2237/24578* (2013.01); *H01J 2237/30488* (2013.01); *H01J 2237/31762* (2013.01)

(56) References Cited

U.S. PATENT DOCUMENTS

| | | | |
|---|---|---|---|
| 10,830,586 B1 * | 11/2020 | Bruland | H01J 37/20 |
| 11,170,976 B2 | 11/2021 | Matsumoto | |
| 2006/0060781 A1 * | 3/2006 | Watanabe | B82Y 40/00 |
| | | | 250/310 |
| 2007/0187595 A1 * | 8/2007 | Tanaka | G01N 23/2251 |
| | | | 250/307 |

FOREIGN PATENT DOCUMENTS

| | | | | |
|---|---|---|---|---|
| JP | 2021-22616 A | | 2/2021 | |
| KR | 10-2015-0018392 A | | 2/2015 | |
| KR | 10-2018-0052099 A | | 5/2018 | |
| KR | 10-2020-0036768 A | | 4/2020 | |
| KR | 10-2021-0012951 A | | 2/2021 | |
| WO | WO-2022248141 A1 * | 12/2022 | ............ | H01J 37/153 |

OTHER PUBLICATIONS

Korean Notice of Allowance issued Feb. 24, 2025 in Korean Patent Application No. 10-2023-0019295 (with unedited computer-generated English translation), 4 pages.

* cited by examiner

OPTICAL SYSTEM ADJUSTMENT METHOD FOR MULTI CHARGED PARTICLE BEAM APPARATUS AND COMPUTER READABLE RECORDING MEDIUM

CROSS REFERENCE TO RELATED APPLICATION

This application is based upon and claims benefit of priority from the Japanese Patent Application No. 2022-021384, filed on Feb. 15, 2022, the entire contents of which are incorporated herein by reference.

FIELD

The present invention relates to an optical system adjustment method for a multi charged particle beam apparatus and a computer readable recording medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is written by using an electron beam writing apparatus, in which a technology commonly known as electron beam lithography is used.

For example, a writing apparatus using a multi-beam is known. A large number of beams can be radiated at one time using a multi-beam, as compared to when a single beam is used for writing, thus the throughput can be significantly improved. In a multi-beam writing apparatus, a multi-beam is formed, for example, by passing an electron beam emitted from an electron gun through a shaping aperture array substrate having a plurality of openings. Each of beams in the multi-beam is blanking-controlled, and each unshielded beam is reduced by an optical system, deflected by a deflector, and irradiated to a desired position on a sample.

In a multi-beam writing apparatus, in order to improve the positional accuracy and the resolution of a writing pattern, the distortion and aberration of a multi-beam on a writing surface (sample surface) need to be reduced. Because an illumination system aberration has a significant effect on distortion and aberration of a multi-beam on the writing surface, the illumination system aberration is required to be reduced. The illumination system aberration is a deviation from an ideally designed trajectory, which occurs in the illumination system, and is a cause of aberration of a crossover (essentially a light source image) formed in the middle of a beam trajectory. Therefore, the illumination system aberration and the crossover aberration are essentially the same, and the illumination system aberration is used in the present specification.

However, it has been not possible to measure an illumination system aberration with high accuracy and to check whether the aberration has sufficiently reduced, thus adjustment of an illumination system has been insufficient.

DETAILED DESCRIPTION

A multi charged particle beam apparatus irradiates a substrate placed on a stage with a multi charged particle beam through an illumination optical system including a plurality of components, and an objective lens successively. In one embodiment, an optical system adjustment method for the multi charged particle beam apparatus includes measuring positional deviation amounts of a plurality of individual beams included in the multi charged particle beam at two or more different heights in an optical axis direction of a measurement surface or an imaging position of the multi charged particle beam, calculating a normalized position difference based on the two or more heights and the positional deviation amounts, the normalized position difference being an illumination system aberration equivalent amount of the illumination optical system, and adjusting a set value for at least one of the plurality of components using a value of the normalized position difference.

In the embodiment below, as an example of an optical system of a multi charged particle beam apparatus, the configuration of an optical system in a multi charged particle beam apparatus using an electron beam will be described. However, the charged particle beam is not limited to an electron beam, and may be a beam using a charged particle such as an ion beam. In addition, the invention is also applicable to not only a writing apparatus, but also an optical system such as a SEM.

Figure 1:
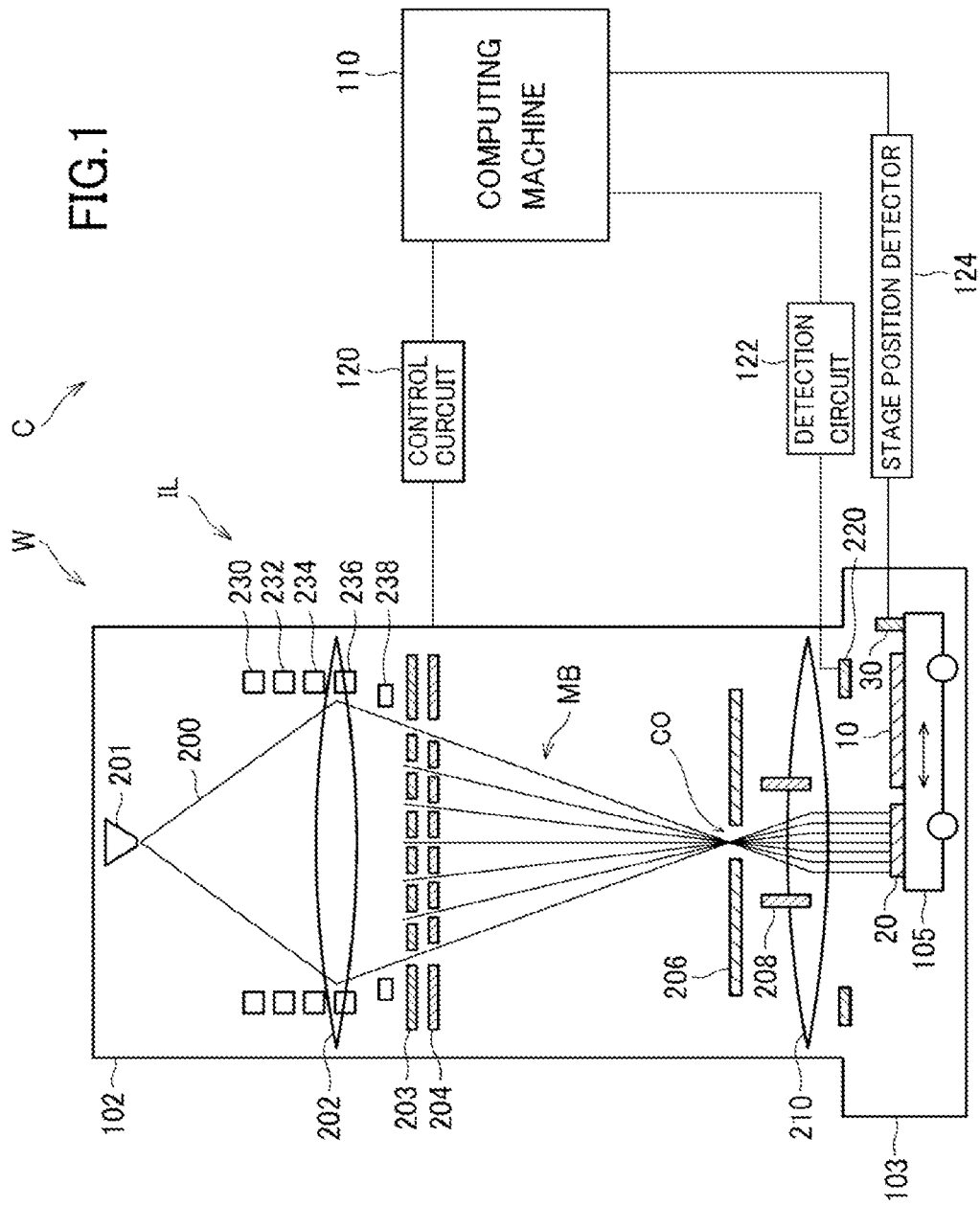
FIG. 1 is a schematic configuration diagram of a writing apparatus according to an embodiment of the present invention.

FIG. 1 is a schematic configuration diagram of a multi beam writing apparatus according to an embodiment of the present invention. As illustrated in FIG. 1, the multi-beam writing apparatus includes a writer W and a controller C. The writer W includes an electron optical column 102, and a writing chamber 103. In the electron optical column 102, an electron gun 201, an illumination optical system IL, a shaping aperture array substrate 203, a blanking aperture array mechanism 204, a limiting aperture substrate 206, a deflector 208 and an objective lens 210 are disposed.

The illumination optical system IL functions to irradiate the shaping aperture array substrate 203 with a beam, and to form a crossover CO at a predetermined downstream position. The crossover CO is a point to which trajectories of the centers of individual beams converge, which have passed through the holes of the shaping aperture array substrate 203. In many optical systems, as in this embodiment, the crossover CO is an image of a crossover (essentially a light source, and may be a virtual image) which is formed in the vicinity of the electron gun 201.

In the example illustrated in FIG. 1, the illumination optical system IL is provided above (upstream of the beam travel direction) the shaping aperture array substrate 203, and one upstream lens achieves the function of beam irradiation and formation of crossover CO. Separately from such a configuration example, in an example of an optical system that irradiates the shaping aperture array substrate 203 perpendicularly with an electron beam, beams are converged again by a lens disposed in a subsequent stage of the shaping aperture array substrate 203 in order to form crossover CO at a predetermined downstream position. In this case, the lens (the lens in order to form crossover CO) in a subsequent stage of the shaping aperture array substrate 203 also functionally constitutes part of the illumination optical system IL.

The illumination optical system IL includes a plurality of components. In the example illustrated in FIG. 1, the illumination optical system IL has an illumination lens 202, an alignment deflector 230, a stigmator 232, a hexapole 234, an octupole 236 and a grating lens 238.

The alignment deflector 230 has a function of deflecting a beam, and adjusts the position and angle of the beam in the illumination lens 202 and the shaping aperture array substrate 203, then mainly corrects the coma aberration of an illumination lens system and the position of crossover CO in a plane.

The stigmator 232 corrects the astigmatism of an illumination lens system.

The hexapole 234 corrects the hexapole aberration component of an illumination lens system.

The octupole 236 corrects the octupole aberration component of an illumination lens system.

The grating lens 238 corrects the spherical aberration of an illumination lens system.

An alignment deflector and a multipole (such as a stigmator, a hexapole, an octupole) are also disposed below (downstream of the beam travel direction) the illumination optical system IL and the shaping aperture array substrate 203; however, the alignment deflector and multipole are not illustrated.

In the writing chamber 103, an XY stage 105 movable in the XY direction (the direction perpendicular to the optical axis of an electron optical system), and a detector 220 are disposed. The XY stage 105 may be movable in the Z direction (the optical axis direction of an electron optical system). A substrate 10 as a writing target is disposed on the XY stage 105. The substrate 10 includes an exposure mask when a semiconductor device is manufactured, and a semiconductor substrate (silicon wafer) on which a semiconductor device is fabricated. In addition, the substrate 10 includes a mask blank which is coated with resist and on which nothing has been written.

Furthermore, a mark 20 is disposed on the XY stage 105. The mark 20 may be movable in the Z direction. The mark 20 is, for example, a metal mark in a cross shape or a minute dot shape. The detector 220 detects reflected electrons (or secondary electrons) when the mark 20 is scanned by the beam.

In addition, a mirror 30 for measuring the position of the stage is disposed on the XY stage 105.

The controller C has a computing machine 110, a control circuit 120, a detection circuit 122 and a stage position detector 124. The stage position detector 124 radiates a laser, receives light reflected from the mirror 30, and detects the position of the XY stage 105 based on the principle of the laser interference method.

In FIG. 1, the components necessary to explain the embodiment are illustrated, and other components are not illustrated. For example, in FIG. 1, the objective lens 210 is a single-stage lens, however, may be a multi-stage lens such as a two-stage lens. The illumination lens 202 may also be a multi-stage lens.

Figure 2:
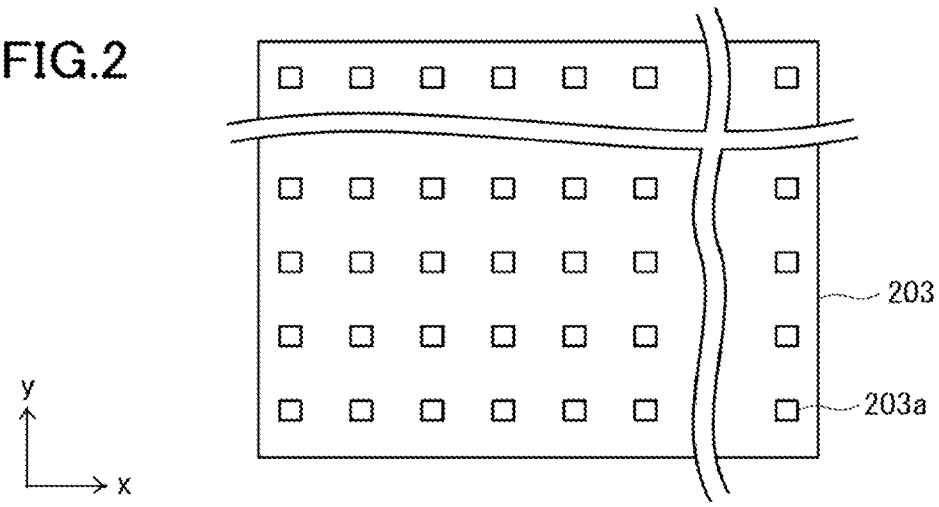
FIG. 2 is a plan view of a shaping aperture array substrate.

FIG. 2 is a conceptual diagram illustrating the configuration of the shaping aperture array substrate 203. In FIG. 2, openings (first openings) 203a in p vertical (y direction) rows×q horizontal (x direction) columns (p, q≥2) are formed in a matrix with a predetermined arrangement pitch in the shaping aperture array substrate 203. The openings 203a are formed as rectangles in the same dimensional shape. The openings 203a may be circular. A multi-beam MB is formed by parts of electron beam 200 respectively passing through the plurality of openings 203a.

The blanking aperture array mechanism 204 is provided below the shaping aperture array substrate 203, and passage holes (second openings) are formed corresponding to the arrangement positions of the openings 203a of the shaping aperture array substrate 203. In each passage hole, a blanker consisting of a set of two electrodes forming a pair is disposed. One electrode of the blanker is fixed to the ground potential, and the other electrode is switched between the ground potential and another potential. An electron beam passing through each passage hole is independently deflected by a voltage applied to a corresponding blanker. In this manner, a plurality of blankers perform blanking deflection on corresponding beams of the multi-beam MB which has passed through the plurality of openings 203a of the shaping aperture array substrate 203.

The electron beam 200 emitted from the electron gun 201 (emitter) is bent (refracted) by the illumination lens 202 to illuminate the entire shaping aperture array substrate 203. The electron beam 200 illuminates an area including the plurality of (all) openings 203a. Part of the electron beam 200 passes through the plurality of openings 203a of the shaping aperture array substrate 203, thereby forming a plurality of electron beams (multi-beam MB). The multi-beam MB passes through corresponding blankers of the blanking aperture array mechanism 204. The blankers perform blanking control on passing respective beams so that each beam is in an ON state for a set exposure time (irradiation time).

The multi-beam MB which has passed through the blanking aperture array mechanism 204 travels to an opening (a third opening) formed in the center of the limiting aperture substrate 206 due to refraction by the illumination lens 202. The multi-beam MB then forms crossover CO at the height position of the opening of the limiting aperture substrate 206.

A beam deflected by a blanker of the blanking aperture array mechanism 204 is displaced from the opening of the limiting aperture substrate 206, and is shielded by the limiting aperture substrate 206. In contrast, a beam not deflected by a blanker of the blanking aperture array mechanism 204 passes through the opening of the limiting aperture substrate 206. In this manner, the limiting aperture substrate 206 shields the beam which is deflected by a blanker to achieve a beam OFF state.

The beam for one shot is formed by the beam which has passed through the limiting aperture substrate 206 during a time from beam ON to beam OFF. Each of the beams in the multi-beam MB which has passed through the limiting aperture substrate 206 becomes an aperture image with a desired reduction ratio of the opening 203a of the shaping aperture array substrate 203 by the objective lens 210, and the focus of the beam is adjusted on the substrate 10. The beams (the entire multi-beam) which have passed through the limiting aperture substrate 206 by the deflector 208 are collectively deflected in the same direction, and radiated to respective irradiation positions of the beams on the substrate 10.

For example, when the XY stage 105 is continuously moved, the irradiation position of each beam is controlled by the deflector 208 so as to follow the movement of the XY stage 105. The beams in the multi-beam MB radiated at one time are ideally arranged with the pitch which is the product of the arrangement pitch of the plurality of openings 203a of the shaping aperture array substrate 203 and the above-mentioned desired reduction ratio. The writing apparatus performs a writing operation by a raster scan method for irradiating with a shot beam sequentially, and when a desired pattern is written, an unnecessary beam is controlled at a beam-off by the blanking control.

Figure 3:
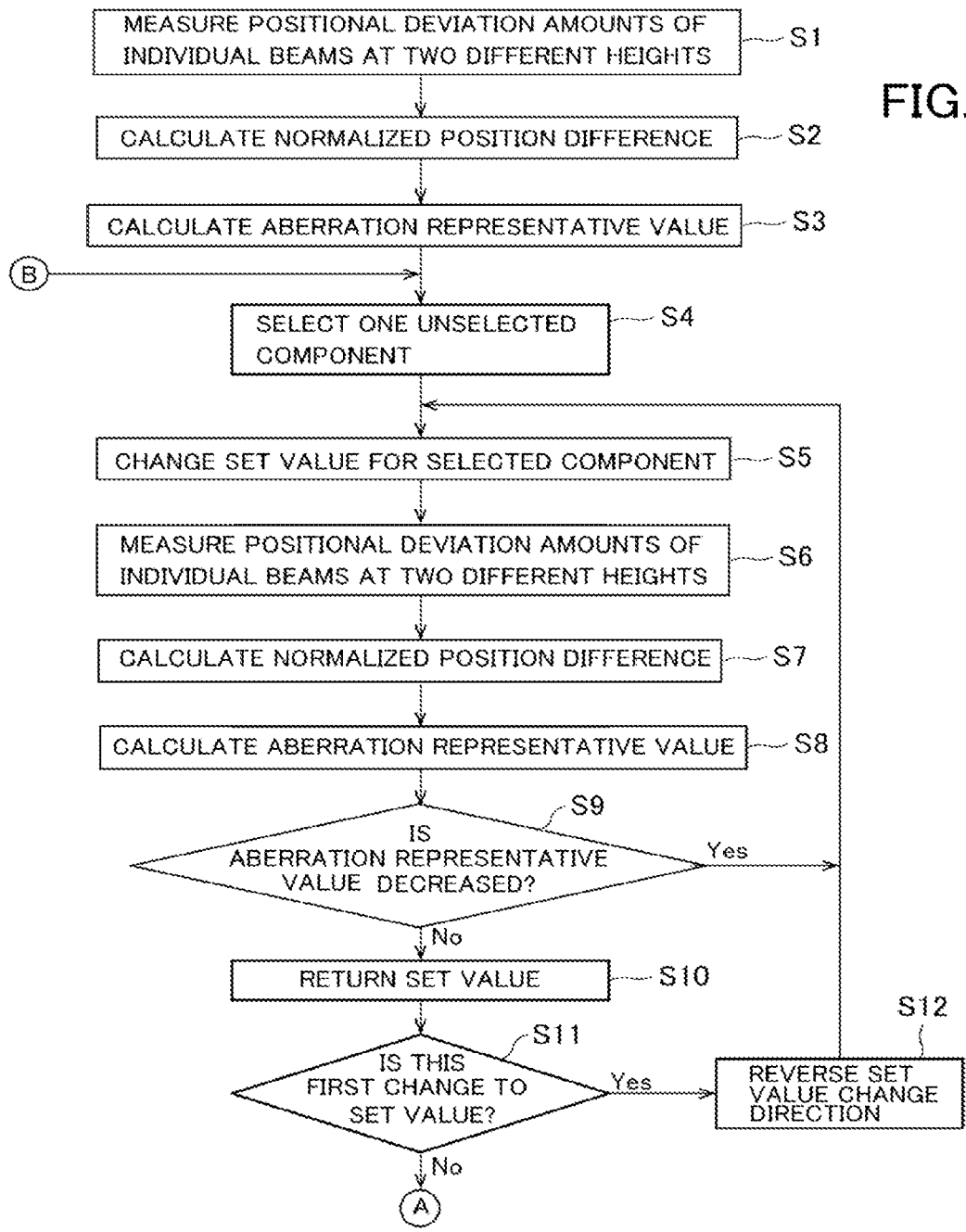
FIG. 3 is a flowchart explaining an adjustment method for an optical system according to the embodiment.
Figure 4:
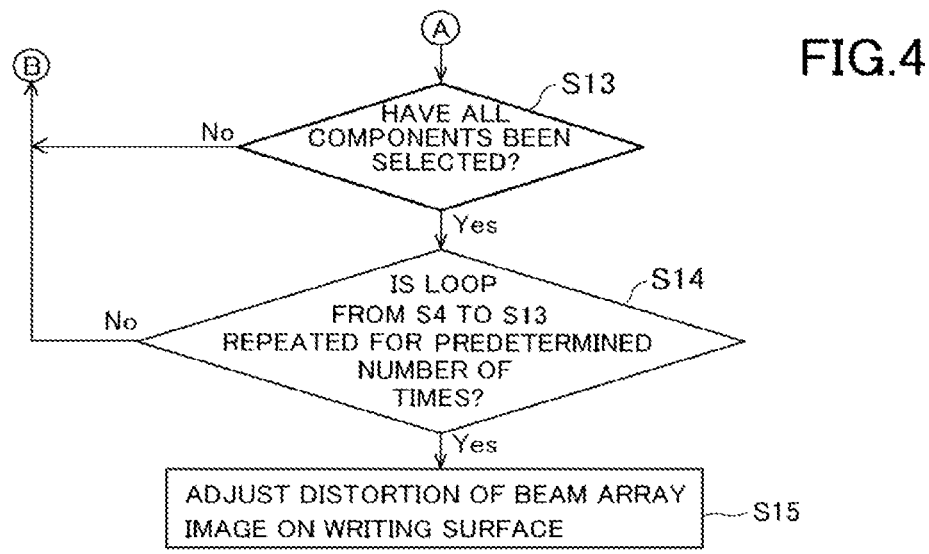
FIG. 4 is a flowchart explaining an adjustment method for the optical system according to the embodiment.

In order to increase the positional accuracy and the resolution of a pattern to be written on the substrate 10, it is necessary to reduce the illumination system aberration which occurs in the illumination optical system IL. An optical system adjustment method to reduce the illumination system aberration will be described with reference to the flowcharts illustrated in FIG. 3, FIG. 4.

First, the positional deviation amounts of a plurality of individual beams among a large number of individual beams included in the multi-beam are measured at two or more different heights in the vicinity of a writing surface (step S1). For example, only the individual beams to be measured are turned on one by one sequentially, each beam is deflected by the deflector 208 to scan the mark 20, and electrons reflected by the mark 20 are detected by the detector 220. The detection circuit 122 informs the computing machine 110 of the amount of electrons detected by the detector 220. The computing machine 110 obtains a scan waveform (including a scan image) from the detected amount of electrons, and calculates the position of each individual beam relative to the position of the XY stage 105. The difference between the calculated beam position and an ideal position is the positional deviation amount. The positional deviation amount is also called distortion. The positional deviation amount may be such that an average positional deviation amount of multiple beams obtained by collectively scanning the multiple beams close to each other (for example, 16×16) is assumed to occur at the central position of the multiple beams.

The individual beam to be turned on is sequentially switched to determine the positional deviation amount of each beam. The reason why the positional deviation amount of each of multiple beams is measured is that the illumination system aberration has an effect on the entire multi-beam, thus information on the multiple beams is necessary to calculate the illumination system aberration. The illumination system aberration cannot be evaluated from information on the positional deviation amount of one beam or the average positional deviation amount of the entire beams. The number of individual beams to obtain a positional deviation amount is determined such that 5×5 beams are selected as a measurement target at regular intervals from 512×512 beams which form a multi-beam.

Note that a minimum required number of individual beams is determined according to the later-described method of calculating an aberration representative value. For example, when the terms up to the third degree of a polynomial approximation of normalized position difference are utilized for calculation of an aberration representative value, it is sufficient to measure positional deviation amounts of individual beams equal or greater in number to the number (specifically, 10) of polynomial coefficients up to the third degree.

Figure 5A:
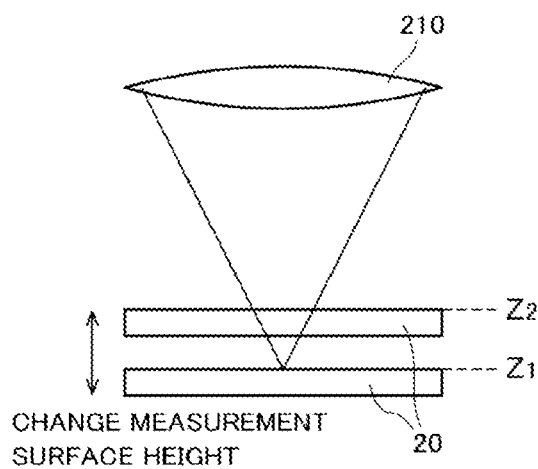
FIGS. 5A and 5B illustrate examples of how to change height when a positional deviation amount of an individual beam is measured.
Figure 5B:
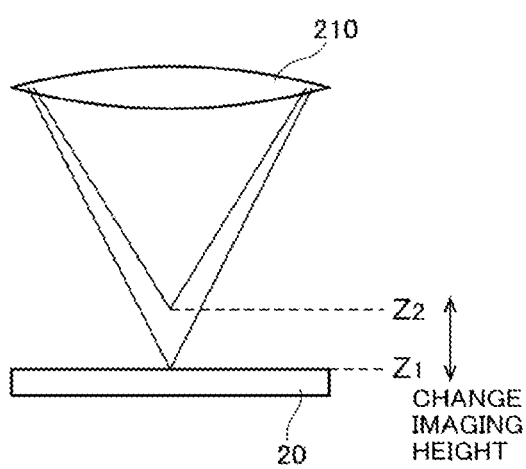

Note that "height is different" or "height is changed" may refer to "changing the measurement surface height and fixing the imaging height" as illustrated in FIG. 5A, in which the height of the surface (measurement surface) of the mark 20 in the optical axis direction to be used for position measurement is changed by moving the XY stage 105 in the Z direction (optical axis direction), and the imaging height of a multi-beam is fixed, or "fixing the measurement surface height and changing the imaging height" as illustrated in FIG. 5B, in which the height of the measurement surface is not changed, and the height of an imaging position of a multi-beam in the optical axis direction is changed. Here, change of the imaging height is made by changing the excitation of the objective lens 210.

In this embodiment, an example will be described where measurement is performed at two heights: height $z_1$ and height $z_2$. The difference between the height $z_1$ and the height $z_2$ is preferably several μm to several tens μm. Note that the beam does not need to be completely focused on the surface (the measurement surface) of the mark 20 at the heights $z_1$, $z_2$. For example, focus may be completely made at one height, and out-of-focus may occur at the other height. Out-of-focuses may occur at both heights.

Let $(x_j, y_j)$ be an ideal position (reference position) of the j-th individual beam to be measured at the height $z_1$, $\beta_j = x_j + iy_j$ be the corresponding complex coordinates, and $\delta w(\beta_j, z_1)$ be the positional deviation amount. $\delta w(\beta_j, z_1)$ is a complex number, where the real part corresponds to the positional deviation amount in the X direction, and the imaginary part corresponds to the positional deviation amount in the Y direction. The positional deviation amount is a positional deviation from an ideal position, thus corresponds to distortion. Let N be the number of individual beams to be measured, then $1 \leq j \leq N$. Note that as in a normal analysis of electron optical system, the origin for the ideal position $(x_j, y_j)$ of the individual beam is on the optical axis of the electron optical system (specifically, the origin is the cross point between the optical axis of the electron optical system and the measurement surface).

Similarly, the positional deviation amount of an individual beam to be measured at the height $z_2$ is represented by $\delta w(\beta_j, z_2)$.

Subsequently, a normalized position difference $\delta w_H(\beta_j)$, which is an illumination system aberration equivalent amount corresponding to the optical system aberration, is calculated using the positional deviation amounts $\delta w(\beta_j, z_1)$ and $\delta w(\beta_j, z_2)$ at two heights measured in step S1, and the expression below (step S2). Hereinafter $\delta w_H(\beta_j)$ is called the normalized position difference. As described below, the normalized position difference is an illumination system aberration equivalent amount. The calculation expression for the normalized position difference $\delta w_H(\beta_j)$ varies with the height setting method in step S1.

When the height setting method in step S1 is "fixing the measurement surface height and changing the imaging height", the normalized position difference $\delta w_H(\beta_j)$ is calculated using the following Expression (1).

$$\delta w_H(\beta_j) = \frac{\delta w(\beta_j, z_2) - \delta w(\beta_j, z_1)}{z_2 - z_1} - k_H \beta_j \quad (1)$$

The beam passage position in the objective lens changes in proportion to the aberration of the illumination system. When the objective lens excitation is changed, the beam position on an imaging surface changes in proportion to the distance between the beam passage position and the lens center. At the same time, the imaging height is changed in proportion to the change of the objective lens excitation. The first term of Expression (1) above calculates the ratio of change of the beam position with respect to the imaging height, and is proportion to the illumination system aberration.

However, the first term of Expression (1) includes not only a component which occurs due to the illumination system aberration, but also a component which occurs even in an ideal state without illumination system aberration. When the height setting method in step S1 is "fixing the measurement surface height and changing the imaging height", the component which occurs even in an ideal state without illumination system aberration is a product of the beam position coordinates and a constant that indicates the rate of change in each of magnification and rotation of the beam with respect to the imaging height when the objective lens excitation is changed.

Therefore, the second term, that is, the component which occurs even in an ideal state without illumination system aberration is subtracted from the first term of Expression (1), thereby determining the normalized position difference $\delta w_H (\beta_j)$ which is an illumination system aberration equivalent amount. $k_H$ in Expression (1) is a complex number which is a constant indicating the rate of change in each of magnification and rotation of the beam when the measurement surface height is fixed and the objective lens excitation is changed provided that the writing apparatus illustrated in FIG. 1 is ideally produced and adjusted. The real part of the constant $k_H$ corresponds to a magnification change, and the imaginary part corresponds to a rotation change. The constant $k_H$ can be calculated by a beam trajectory simulation. Note that the positive direction of the heights $z_1$, $z_2$ is determined in a manner consistent with the setting of coordinates in the calculation of the constant $k_H$.

Chromatic aberration coefficients may be calculated by a simulation, and the constant $k_H$ may be calculated as $k_H = k_T / k_X$ using $k_X$ as the axial chromatic aberration coefficient, and $k_T$ as the transverse chromatic aberration coefficient. When the objective lens is an electrostatic lens, a similar constant not with respect to change in the excitation, but with respect to change in an applied voltage may be calculated and used. The imaging height of the multi-beam may be changed by changing the voltage applied to an electrostatic focus correction lens (not illustrated), not to the objective lens. In the explanation so far, an example has been described where the imaging height is changed by changing the excitation of one objective lens; however, the excitation of a plurality of objective lenses may be changed. In this case, the amount of excitation of the plurality of objective lenses is changed in a constant ratio, and the constant $k_H$ is calculated by performing a trajectory simulation under the condition that the amount of excitation is changed in the constant ratio.

When the height setting method in step S1 is "changing the measurement surface height and fixing the imaging height", the normalized position difference $\delta w_H(\beta_j)$ is calculated using the Expression (2) below. The first term of Expression (2) calculates the ratio of change of the beam position with respect to the measurement surface height. The first term of Expression (1) is with respect to the height of the imaging surface, and the first term of Expression (2) is with respect to the height of the measurement surface; however, both calculate the ratio of change of the beam position with respect to height.

$$\delta w_H(\beta_j) = -\frac{\delta w(\beta_j, z_2) - \delta w(\beta_j, z_1)}{z_2 - z_1} + L_A \beta_j \quad (2)$$

The beam passage position in the objective lens changes in proportion to the aberration of the illumination system, and as a result, the landing angle (incidence angle) to the measurement surface changes. When the height of the measurement surface is changed, the beam position on the measurement surface is changed in proportion to the landing angle. The first term of Expression (2) calculates the ratio of change of the beam position with respect to the measurement surface height, in other words, the landing angle which is proportional to the illumination system aberration.

However, the first term of Expression (2) includes not only a component which occurs due to the illumination system aberration, but also a component which occurs even in an ideal state without illumination system aberration.

When the height setting method in step S1 is "changing the measurement surface height and fixing the imaging height", the component which occurs even in an ideal state without illumination system aberration is the product of the beam position coordinates and a constant that indicates the ratio between the sample plane beam position and the landing angle (ideal design landing angle). Therefore, the second term, that is, the component which occurs even in an ideal state without illumination system aberration is subtracted from the first term of Expression (2), thereby determining the normalized position difference $\delta w_H(\beta_j)$ which is an illumination system aberration equivalent amount.

$L_A$ in Expression (2) is a complex number which is a constant indicating the ratio between the writing surface incident position and the landing angle of the individual beam provided that the writing apparatus illustrated in FIG. 1 is ideally produced and adjusted. The real part of the constant $L_A$ corresponds to the landing angle in a radial direction, and the imaginary part corresponds to the landing angle in a rotational direction. The constant $L_A$ can be calculated as follows using an off-axis trajectory $w_b$ calculated by a beam trajectory simulation: $L_A = w_b'(z_i)/w_b(z_i)$, where $z_i$ is an image surface coordinate value (imaging surface position). Note that the positive direction of the heights $z_1$, $z_2$ is determined in a manner consistent with the setting of coordinates in the calculation of the constant $L_A$.

Subsequently, an aberration representative value is calculated from the illumination system aberration equivalent amount (specifically, the normalized position difference $\delta w_H(\beta_j)$) (step S3). The aberration representative value is, for example, the square root of the sum of squares of the absolute value of each element (value for each beam) of the normalized position difference $\delta w_H(\beta_j)$.

The normalized position difference $\delta w_H(\beta_j)$ may be approximated by a polynomial using the beam position as a parameter, and the aberration representative value may be given by the sum of terms of low degree (for example, the sum of absolute values of terms of zero degree to third degree at a beam area end). Fourier transform may be performed on the normalized position difference $\delta w_H(\beta_j)$, and the absolute values of terms of low degree may be selected as needed.

Subsequently, the set values for the components of the illumination optical system IL are adjusted sequentially. The components of the illumination optical system IL are the illumination lens 202, the alignment deflector 230, the stigmator 232, the hexapole 234, the octupole 236, and the grating lens 238. One unselected component is selected from these components (step S4). Note that for a component having two set values for XY like an alignment deflector, XY is treated as different components, and first, alignment deflector X, then alignment deflector Y are selected in that order, for example.

The set value for each selected component is changed (slightly changed) by a predetermined amount (step S5). The set value includes an exciting current and an applied voltage.

After the set value is changed, the positional deviation amount of individual beam at two or more heights is measured (step S6), the normalized position difference is calculated (step S7), and the aberration representative value is calculated (step S8). The processes in steps S6 to S8 are the same as those in steps S1 to S3 described above, thus a description is omitted.

When the aberration representative value is decreased due to the change of the set value for the component (Yes in step S9), the flow returns to step S5, and the set value for the component is further changed by a predetermined amount in the same direction as in the previous change. The processes in steps S5 to S8 are repeated until the aberration representative value no longer decreases.

A relationship or a tendency between the amount of change in the set value, and the amount of change in the normalized position difference and the aberration representative value is determined in advance for each component by actual measurement or a simulation, and may be utilized (in other words, may be utilized to determine the predetermined amount) to change the set value in step S5.

When the aberration representative value is increased or not changed due to the change of the set value for the component (No in step S9), the set value for the component is returned to the previous state (step S10). The number of times of change of the set value in step S5 is determined (step S11). When the number of times of change is one, the direction in which the set value is changed is reversed (step S12), and the flow returns to step S5 to change the set value for the component by a predetermined amount.

For example, when the aberration representative value is increased due to increase in the applied voltage by a predetermined amount in the first change of the set value, the set value is returned to the initial value, and the applied voltage is decreased by a predetermined amount in the second change of the set value.

When the number of times of change of the set value is greater than or equal to two, adjustment of the set value for the component is completed. When there is a component for which the set value has not been adjusted (No in step S13), the flow returns to step S4. For all components of the illumination optical system IL, the processes in steps S5 to S12 are performed sequentially to adjust the set value.

The order of adjustment of set values for the components of the illumination optical system IL is not particularly limited. However, as an example, the set values are adjusted in the order of the alignment deflector 230, the illumination lens 202, the stigmator 232, the hexapole 234, the octupole 236, and the grating lens 238. When the set value for the alignment deflector 230 is changed, it is often the case that the beam trajectory is significantly changed, and the aberration is also changed greatly, thus it is often efficient to first adjust the set value for the alignment deflector 230.

After the set values for all components are adjusted (Yes in step S13), the flow returns to step S4 again. This loop (the loop from step S4 to step S13) is repeated for a predetermined number of times (normally about 2 to 5 times).

After the loop from step S4 to step S13 is executed for a predetermined number of times (Yes in step S14), excitation of the alignment deflector and the multipoles provided below (downstream of the beam travel direction) the blanking aperture array mechanism 204 is adjusted by a publicly known method, and distortion of a beam array image on the writing surface is adjusted (step S15). In addition, beam movement (the average of the movements of all beams, or the beam movements near centers of all beams) on the writing surface with the excitation of the objective lens 210 slightly changed is measured, and the excitation of the alignment deflector and the multipoles is adjusted so that the amount of beam movement is minimized.

In this manner, a pattern is written on the substrate 10 using a writing apparatus for which the optical system has been adjusted. First, the computing machine 110 reads writing data from a storage device (not illustrated), and performs a multi-stage data conversion process on the writing data to generate shot data specific to the apparatus. The shot data defines the irradiation amount and irradiation position coordinates of each shot.

The computing machine 110 outputs the irradiation amount of each shot to the control circuit 120 based on the shot data. The control circuit 120 determines an irradiation time t by dividing the input irradiation amount by a current density. When making a corresponding shot, the control circuit 120 controls a deflection voltage to be applied to a corresponding blanker so as to achieve beam ON for the irradiation time t.

The computing machine 110 outputs deflection position data to the control circuit 120 so that each beam is deflected to the position (coordinates) indicated by the shot data. The control circuit 120 calculates the amount of deflection, and applies a deflection voltage to the deflector 208. Thus, the multi-beam to be shot this time is collectively deflected.

As described above, according to this embodiment, it is possible to reduce the illumination system aberration efficiently and reliably and to write a pattern with high positional accuracy and resolution on the substrate.

The normalized position difference $\delta w_H(\beta_j)$ may be determined using a simplified expression such as Expression (3) below. This Expression is a simplified expression in which the second terms in the above Expressions (1), (2) are omitted, and is applicable regardless of the height setting method in steps S1, S6. When the simplified expression is compared with the above Expressions (1), (2), the term of $k_H$ or $L_A$ is omitted. However, omission of these terms has little effect in many cases because normally, optical design is often made to reduce these coefficients. Although the sign of the first term of Expression (2) is different from the sign of the first term of Expression (3), the effect of the sign may be eliminated by taking the absolute values of relevant terms when the aberration representative value is calculated.

$$\delta w_H(\beta_j) = \frac{\delta w(\beta_j, z_2) - \delta w(\beta_j, z_1)}{z_2 - z_1} \quad (3)$$

In addition, when the heights $z_1$, $z_2$ are constant, the normalized position difference $\delta w_H(\beta_j)$ may be determined using a further simplified numerical expression like the following Expression (4).

$$\delta w_H(\beta_j) = \delta w(\beta_j, z_2) - \delta w(\beta_j, z_1) \quad (4)$$

In the above embodiment, the difference between the positional deviation amounts at two heights is determined as shown by the first terms of Expressions (1), (2); however, the difference of the positions of each beam at two heights may be used. Although the positional deviation amounts at two heights are used above, the positional deviation amounts at three or more heights may be used. When three or more heights are used, for the first terms of Expressions (1), (2), the rate of change in the positional deviation amount with respect to height change may be used instead of simple division. The rate of change can be calculated, for example, by the least-squares method.

Each step in the optical system adjustment method described above is executed by the computing machine 110 controlling the control circuit 120, the detection circuit 122 and the stage position detector 124 to cause each component of the writer W to operate. The computing machine 110 may be comprised of hardware such as an electric circuit or comprised of software. When the computing machine 110 is comprised of software, a program to implement at least part of the function of the computing machine 110 may be stored in a non-volatile recording medium, and read into a computer including an electric circuit and executed by the computer.

In the description so far, an example has been shown where measurement of the positional deviation amount of each beam is made using signals obtained by scanning the mark; however, the measurement may be replaced by distortion measurement of a writing pattern. For example, pattern writing may be performed with the height of a beam imaging position changed by changing the objective lens excitation, and distortion measurement of the pattern may be made.

Furthermore, pattern writing may be performed by two types of excitation while changing the set value for each component successively, so that distortion measurement of those patterns is made, the normalized position difference is calculated, the aberration representative value is calculated, and the set value for each component to achieve a smallest aberration representative value is selected and set.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An optical system adjustment method for a multi charged particle beam apparatus that irradiates a substrate placed on a stage with a multi charged particle beam through an illumination optical system including a plurality of components, and an objective lens successively, the optical system adjustment method comprising:
   measuring positional deviation amounts of a plurality of individual beams included in the multi charged particle beam at two or more different heights in an optical axis direction of a measurement surface or an imaging position of the multi charged particle beam;
   calculating a normalized position difference based on the two or more heights and the positional deviation amounts, the normalized position difference being an illumination system aberration equivalent amount of the illumination optical system; and
   adjusting a set value for at least one of the plurality of components using a value of the normalized position difference.

2. The method according to claim 1,
   wherein an aberration representative value is calculated using the value of the normalized position difference, and
   the set value for at least one of the plurality of components is adjusted so that the aberration representative value decreases.

3. The method according to claim 1,
   wherein the heights in the optical axis direction are each a height of the imaging position of the multi charged particle beam in the optical axis direction,
   the height of the imaging position of the multi charged particle beam is changed, and positional deviation amounts of the plurality of individual beams are measured, and
   the normalized position difference is calculated by subtracting a product of beam position coordinates and a constant from a rate of change in the positional deviation amount with respect to the change in the height of the imaging position, the constant indicating a rate of change in each of magnification and rotation of a beam with respect to the height of the imaging position, the rate of change being caused by the change of the height of the imaging position.

4. The method according to claim 3,
   wherein the height of the imaging position is changed by changing excitation of the objective lens.

5. The method according to claim 1,
   wherein the heights in the optical axis direction are each a height of a surface of a mark for beam position measurement in the optical axis direction provided on the stage,
   the height of the surface of the mark is changed by vertically moving the mark for beam position measurement, and positional deviation amounts of the plurality of individual beams are measured, and
   the normalized position difference is calculated by subtracting a rate of change in the positional deviation amounts with respect to the change in the height of the surface of the mark from a product of beam position coordinates and a constant indicating a ratio between a writing surface incident position and a landing angle of a beam.

6. The method according to claim 1,
   wherein the plurality of components include at least one of an illumination lens, an alignment deflector, a stigmator, a hexapole, an octupole and a grating lens.

7. The method according to claim 2,
   wherein as the aberration representative value, a square root of a sum of squares of an absolute value of the normalized position difference for each of the plurality of individual beams is calculated.

8. The method according to claim 2,
   wherein the normalized position difference for each of the plurality of individual beams is approximated by a polynomial using a beam position of the individual beam as a parameter, and the aberration representative value is calculated based on the polynomial.

9. The method according to claim 8,
   wherein a sum of terms of low degree of the polynomial is calculated as the aberration representative value.

10. A non-transitory computer readable recording medium storing a program causing a computer to execute a process for adjusting an optical system of a multi charged particle beam apparatus that irradiates a substrate placed on a stage with a multi charged particle beam through an illumination optical system including a plurality of components, and an objective lens successively, the process comprising the steps of:
    measuring positional deviation amounts of a plurality of individual beams included in the multi charged particle beam at two or more different heights in an optical axis direction of a measurement surface or an imaging position of the multi charged particle beam;

calculating a normalized position difference based on the two or more heights and the positional deviation amounts, the normalized position difference being an illumination system aberration equivalent amount of the illumination optical system; and adjusting a set value for at least one of the plurality of components using a value of the normalized position difference.

\* \* \* \* \*